United States Patent [19]
Moody et al.

[11] Patent Number: 5,729,130
[45] Date of Patent: Mar. 17, 1998

[54] TRACKING AND HOLDING IN A DAC THE PEAKS IN THE FIELD-PROPORTIONAL VOLTAGE IN A SLOPE ACTIVATED MAGNETIC FIELD SENSOR

[76] Inventors: Kristann L. Moody, 77 Priest Rd., Barrington, N.H. 03825; Ravi Vig, 27 Longview Dr., Bow, N.H. 03304; Jay M. Towne, RRI Box 1957, Andover, N.H. 03216; Teri L. Tu, 15 Clough St., Bow, N.H. 03304

[21] Appl. No.: 587,405

[22] Filed: Jan. 17, 1996

[51] Int. Cl.[6] .............................. G01B 7/14; G01R 33/00; G01N 27/72
[52] U.S. Cl. ................ 324/207.12; 324/225; 324/239
[58] Field of Search .......................... 324/173, 174, 324/207.12, 207.2, 207.21, 207.25, 207.24, 225, 234, 235, 239, 251, 252

[56] References Cited

U.S. PATENT DOCUMENTS

| | | |
|---|---|---|
| 5,442,283 | 8/1995 | Vig et al. .................. 324/207 |
| 5,493,219 | 2/1996 | Makino et al. ........... 324/207.25 |

OTHER PUBLICATIONS

An Engineering Approach to Digital Design, William I. Fletcher, pp. 14–19, Prentice Hall, Inc., 1980.
Data Acquisition and Conversion Handbook; pp. 16–17, Datel–Intersil, Inc.; Mansfield, Massachusetts; 1980.

Primary Examiner—Walter E. Snow

[57] ABSTRACT

In a proximity-detector, a Hall transducer produces a signal Vsig. Two counters, P-counter and N-counter count pulses from a clock and produce count signals respectively to two DACs, PDAC and NDAC. The DACs output signals track and hold, respectively, the positive pulses and negative pulses in Vsig. These output signals are compared with Vsig to produce a proximity-detector binary output voltage Vout that becomes high when a tracking voltage $V_{DAC-P}$ produced by PDAC rises to each peak positive voltage $V_{pk}$ in Vsig, and that becomes low when a tracking voltage $V_{DAC-P}$ falls to each peak negative voltage in Vsig. The peak $V_{DAC-P}$ is held until Vsig drops by a fixed amount below $V_{pk}$ to produce an output pulse that resets the counter connected to PDAC at a time shortly following the actual peak in Vsig. Similarly, the peak $V_{DAC-N}$ is held until Vsig rises a fixed amount above $V_{DAC-N}$ to produce an output pulse that resets the counter connected to NDAC. The N-counter is reset at $t_{npk}$ by the negative-peak indicating signal $V_{Ncomp}$ and is enabled at $t_{ppk}$ by the positive-peak indicating signal $V_{Pcomp}$, while the P-counter reset by the positive peak indicating signal $V_{Pcomp}$ and enabled by $V_{Ncomp}$. This proximity detector detects articles passing at rates down to zero.

11 Claims, 3 Drawing Sheets

TRACKING AND HOLDING IN A DAC THE PEAKS IN THE FIELD-PROPORTIONAL VOLTAGE IN A SLOPE ACTIVATED MAGNETIC FIELD SENSOR

BACKGROUND

This invention relates to a proximity detector, and especially to a ferrous-gear-tooth Hall sensor with an attached magnet capable of detecting the onsets of leading and trailing gear tooth edges of an adjacent rotating ferrous gear, and more particularly relates to such a Hall sensor capable of such detecting at gear tooth speeds down to zero speed.

In the patent U.S. Pat. No. 5,442,283, issued Aug. 15, 1995 there is described a Hall-voltage slope-activated sensor capable of detecting the rising and falling edges of a gear tooth, which sensor includes a circuit for tracking a slope of a Hall voltage and briefly holding the ensuing peak voltage before producing a pulse signal indicating the onset of the following Hall-voltage slope of opposite direction. The Hall voltage holding circuit includes a capacitor and circuit means for controllably leaking charge out of or into the capacitor for preventing false tripping of a comparator that provides the pulse output signal. The holding voltage of the capacitor thus has a droop which leads to increasing loss of holding accuracy as the speed of gear tooth passage becomes slower, and therefore the detector has a minimum gear tooth speed at which accurate detection is possible. And in a range of very slow speeds down to zero speed, there is no detection at all.

It is an object of the present invention to provide a magnetic article proximity detector that is capable of accurate operation over a wide range of speeds of magnetic-article passage down to zero.

SUMMARY OF THE INVENTION

A method for detection of passing magnetic articles comprises sensing an ambient magnetic field and generating a voltage, Vsig, that is proportional to the magnetic field, converting positive slope portions only of the analog signal Vsig to a digital signal $V_{Pcount}$, converting the digital signal $V_{Pcount}$ to a positive Vsig-tracking analog signal $V_{DAC-P}$, holding $V_{Pcount}$ at each peak positive excursion in Vsig, and when at time $t_{ppk}$ after each positive peak in Vsig, Vsig has fallen below $_{DAC-P}$ by a predetermined amount, producing one detector pulse (Vpcomp) indicating the detection of approach of a passing magnetic article. The preferred method additionally includes converting negative slope portions only of the analog signal Vsig to a digital signal $V_{Ncount}$, converting the digital signal $V_{Ncount}$ to a negative Vsig-tracking analog signal $V_{DAC-N}$, holding $V_{Ncount}$ at each peak negative excursion in Vsig, and when at time $t_{npk}$ after each negative peak in Vsig, Vsig has risen above $_{DAC-N}$ by a predetermined amount, producing another detector pulse (Vncomp) indicating the detection of leaving of a passing magnetic article.

The method may be additionally comprised of, at time $t_{ppk}$ enabling starting the converting of the digital signal $V_{Ncount}$ to a negative Vsig-tracking analog signal $V_{DAC-N}$, and at time $t_{npk}$ starting the converting of the positive slope portions only of the analog signal Vsig to a digital signal $V_{Pcount}$ The method may also include generating a binary output signal that at times $t_{ppk}$ changes to one binary level and that at times $t_{npk}$ changes from the one to the other binary level, so that the binary output signal is at one level when the magnetic-field proportional signal, Vsig, has a positive slope and is at the other level when the magnetic-field proportional signal, Vsig, has a negative slope.

This invention also encompasses a proximity sensor of magnetic articles that includes a magnetic-field-to-voltage transducer for generating a signal, Vsig, that is proportional to the magnetic field. The transducer may for example consist of a Hall element followed by a Hall-voltage amplifier. One digital signal is generated by one transducer-voltage comparator (OTVcomp), a first circuit branch directly connects the output of the transducer and the one OTVcomp input, and a second circuit branch connected between the transducer output and another input of the OTVcomp.

The second circuit branch is for producing a binary detector output signal having a transition of one polarity at the time of the occurrence of a positive peak $t_{ppk}$ in Vsig, and toward doing so employs a positive peak detector (PPD) comprised of the one Schmitt comparator (OScomp) having one input connected via the first circuit branch to the transducer output, employs one digital-to-analog converter (P-DAC) that has an output connected to the another input of the OTVcomp, employs a clock that generates a stream of clock pulses, and employs one AND gate.

One counter has a count input connected to the output of the clock, and has a count enable input connected to the output of the OTVcomp via the one AND gate which entails the OTVcomp output being connected to one of the one AND gate inputs. The one counter counts the clock pulses only when an enable signal at one binary level appears at the count enable input. The one counter counts the clock pulses only when Vsig has a positive slope. The P-DAC additionally tracks a positive slope portion of Vsig and holds the ensuing positive peak voltage of Vsig until a time $t_{ppk}$ at which Vsig recedes from the held positive peak voltage by an amount equal to the threshold Vhys of the OScomp. The pulse output from the OScomp comparator indicates the time of peaking of a positive pulse in the transducer signal Vsig. A reset signal generating means is connected to the output of the one OScomp which generating means has an output connected to the reset input of the counter for resetting the one counter at time $t_{ppk}$.

In a further development of the detector circuit, the second circuit branch additionally includes a negative peak detector (NPD), that may be a mirror image circuit to the positive peak detector (PPD), and thus including another transducer-voltage comparator (ATVcomp), an N-DAC, another Schmitt comparator (AScomp) and another AND gate. The AScomp output is connected to the another input of the another AND gate to cause in the another Schmitt comparator output a transition of one polarity at the time of the occurrence of a negative peak $t_{npk}$ in Vsig.

The NPD is further for disabling the one counter at the beginning of the next positive slope portion, and thereby causing the output of the P-DAC to go to zero. This permits the one counter to count and the P-DAC to track and hold the voltage Vsig, as before, during the next positive slope portion of Vsig. These features constitute synergy between the NPD and the PPD whereby the positive and negative tracking of Vsig is, during each period in Vsig, triggered by the NPD to begin in the PPD and visa versa.

The first and second digital signals generated in the clock during the tracking respectively of the positive and negative slopes in Vsig makes it possible to hold indefinitely the peak values in the counter, and thus in the P-DAC and the N-DAC, and therefore enables the proximity detector of this invention to detect the passing of magnetic articles at down

3 to zero speeds, unlike in any of the prior art proximity detectors of the past half a century.

BRIEF DESCRIPTION OF THE DRAWINGS

FIGS. 2 and 3 are drawn to the same time scale.

DESCRIPTION OF PREFERRED EMBODIMENTS

Figure 1:
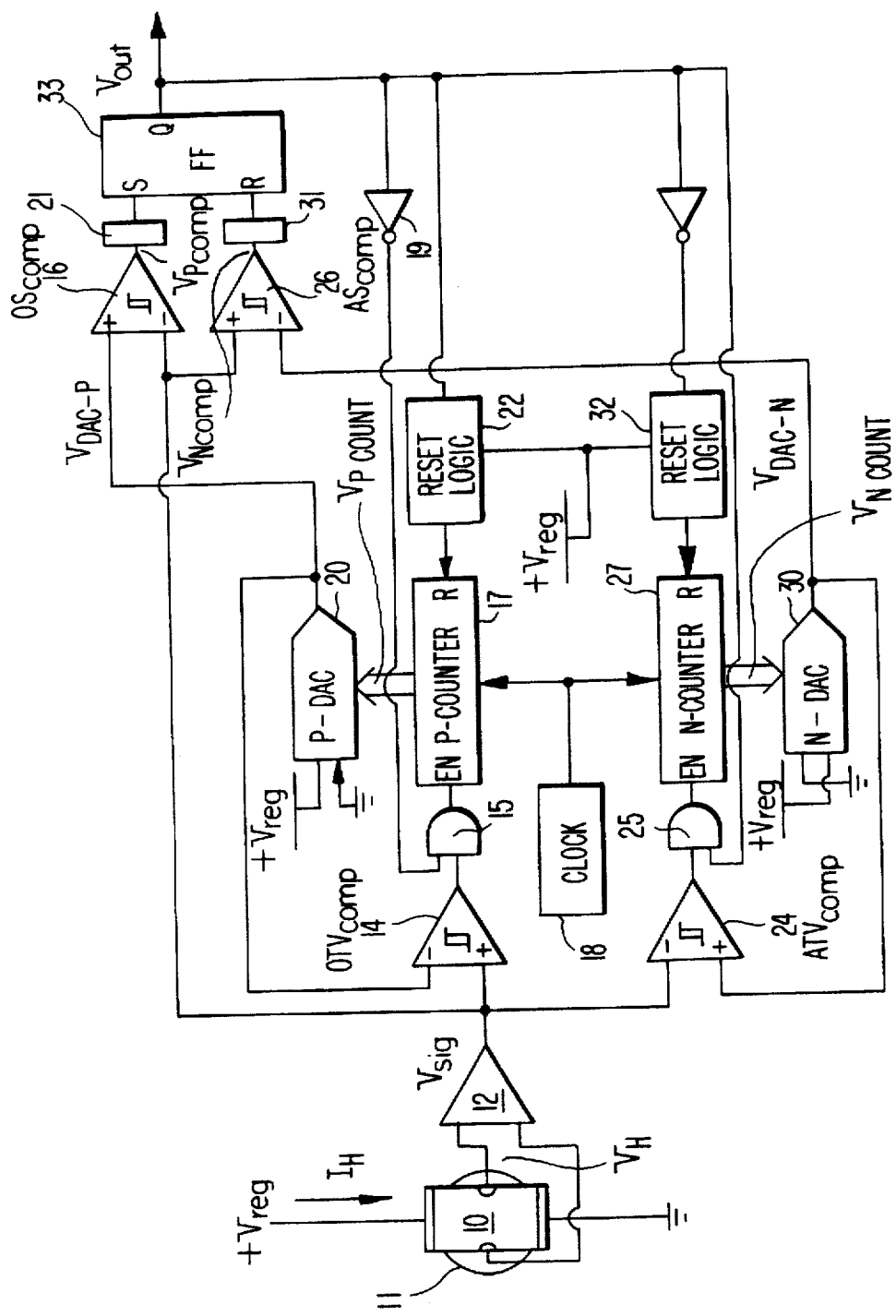
FIG. 1 shows a block diagram of a first magnetic-article proximity detector of this invention.

The Hall element 10 of FIG. 1 is energized by a current $I_H$ and has an output connected to the input of a Hall voltage amplifier 12. Hall element 10 is mounted at a pole of a magnet 11, so that when a ferrous article approaches, the Hall voltage $V_H$ and the amplified Hall voltage Vsig increase (or decrease); and when the article recedes, $V_H$ and Vsig decrease (or increase depending on the polarity of the magnet pole). Alternatively, the sensor circuit of FIG. 1 may be used to detect magnetic articles that themselves are magnetized, in which case the Hall element need not be mounted adjacent a magnet, e.g. the magnet 11.

A magneto resistors bridge (not shown) may be substituted for the Hall element. And two Hall elements with their outputs connected differentially to the input of the Hall voltage amplifier (not shown) represents a second alternative magnetic-field-to-voltage transducer.

The amplified Hall voltage Vsig is manipulated by the remaining circuits in the proximity detector of FIG. 1 to produce an output logic signal, Vout, having a profile that reflects the profile of the passing articles. This is partially accomplished by tracking the positive going portions of Vsig and detecting the next positive peak, which function is implemented by an upper portion of the circuit in FIG. 1. This upper portion of the circuit and its function will be described first.

The amplified Hall voltage Vsig is applied to the negative input of a first comparator 14 via AND gate 15, and also is applied to the negative input of a second comparator 16. When the output of the first comparator 14 goes high the P-counter 17 begins counting the clock pulses from clock

4

18. The resulting count signal, $V_{Pcount}$ is presented to the digital-to-analog converter (DAC) 20 which produces an output analog voltage $V_{DAC-P}$ lying within the range from zero to the applied DC voltage, +Vreg. Thus, at any instant the amplitude of $V_{DAC-P}$ is a direct linear function of the applied count signal.

When power is first applied to the detector circuit, logic block 22 senses the time of turning on of the DC supply voltage, +Vreg, and resets the counter to zero count at start up.

Figure 2:
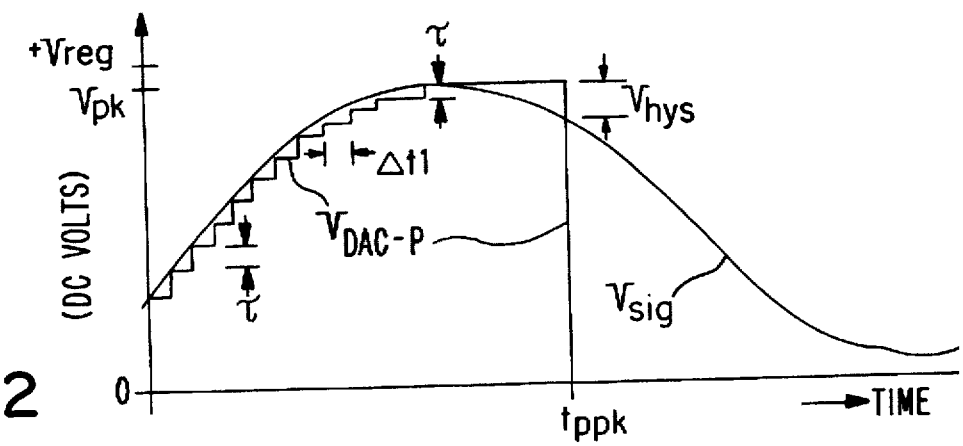
FIG. 2 shows a waveform of the Hall voltage, Vsig, in the circuit of FIG. 1 which wavevform corresponds to the passage of one ferrous gear tooth (or other magnetic article).

The comparator 14 has a small hysteresis and so is a Schmitt type comparator. The output of the DAC 20 is connected to the negative input of the comparator 14 so that whenever Vsig is greater than voltage $V_{DAC-P}$ plus the small hysteresis threshold voltage of the Schmitt comparator 14, then the comparator 14 output is high and the P-counter 17 is enabled and counting. When Vsig is growing more positive, $V_{DAC-P}$ is caused to track Vsig in stair step fashion, as is illustrated in FIG. 2. The incremental vertical excursions of the stair stepped $V_{DAC-P}$, τ, are equal to the least significant bit of the DAC (in millivolts) while the incremental horizontal times $\Delta t1$ increase as the slope of Vsig decreases. The hysteresis threshold of Schmitt comparators 14 and 24 are smaller than the incremental excursions respectively in $V_{DAC-P}$ and $V_{DAC-N}$, so have no effect on the size of those excursions.

Figure 3:
FIG. 3 shows the waveform of the output signal, Vcomp, from the comparator, OScomp, of FIG. 1. Each pulse in Vcomp indicates the onset of the trailing edge of the single passing gear tooth.
Figure 4:
FIG. 4 again shows a waveform of Vout in the circuit of FIG. 1.

When the peak voltage of Vsig is reached, the P-counter 17 stops counting and $V_{DAC-P}$ holds this peak voltage Vpk until time $t_{ppk}$. At time $t_{ppk}$, Vsig has dropped below the peak held voltage by an amount equal to the threshold voltage, Vhys, of the second Schmitt type comparator 16. At time $t_{ppk}$ the output of the second comparator 16 Vpcomp briefly goes high, as seen in FIG. 3 and sets the flip flop 33 causing the Q output of flop 33 to go high as seen in FIG. 4.

The Q output of comparator 33 is connected to the reset input of the P-counter 17 via logic block 22. Logic block 22 generates a reset pulse that resets the counter 17 to zero count, only at the occurrence of a low-to-high transition in the signal Vout. This causes the output voltage of the DAC, $V_{DAC-P}$, to drop to zero volts which terminates the high output pulse in the signal Vpcomp.

This comparator output pulse, Vpcomp, tends to be very narrow and it may be desirable to employ a logic block 21 in the connection from the output of the second comparator 16 to the input of the flip flop 33 for increasing the pulse width toward providing greater reliability of the logic functions.

Figure 5:
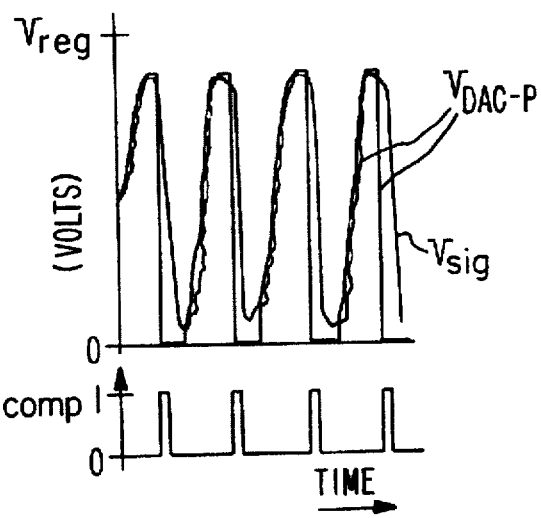
FIG. 5 shows the waveform of several periods in the amplified Hall voltage, Vsig, in the detector of FIG. 1.
Figure 6:
FIG. 6 is drawn to the same scale as FIG. 5 and shows the pulses in signal the Vcomp that correspond to the positive peaks in the Hall voltage Vsig.

FIGS. 5 and 6 show the repetitive nature of the output signal Vsig that follows in a gear tooth sensing application, wherein the positive peaks in Vsig may correspond to the passing of successive gear teeth, and a pulse appears in the comparator output voltage Vpcomp just after each occurrence ($t_{ppk}$) of a positive peak voltage in Vsig, and in each such successive instant the signal Vout goes high.

At each such occurrence ($t_{ppk}$), it is necessary to disable the P-counter 17 to keep it inactive during the subsequent negative slope portion of the amplified Hall voltage Vsig. This is accomplished by connecting the output of flip flop 33 to the second input of AND gate 15 via invertor 19.

Vsig is shown in FIGS. 2 and 5 as having broad peaks to provide a clear picture of the relationship between Vsig and $V_{DAC-P}$. In most practical situations, the magnetic articles to be detected have a geometry and a path of approach to the Hall element so that the Hall voltage $V_H$ and Vsig have a more nearly square waveform than the broadly rounded peaks signal Vsig shown in FIGS. 2 and 5.

5

For the more typical flat topped Vsig signal (not shown), the counter reset time $t_{ppk}$ occurs essentially at the end of the peak in the amplified Hall voltage, Vsig, which corresponds to the beginning of the ensuing downward slope of Vsig, which for example may further correspond to the beginning of a trailing edge of a passing gear tooth.

In a prior art slope-activated detector, as the speed or rate of the passing magnetic articles goes lower and lower, in a fixed time scale Vsig appears more and more rounded (since it cannot have been perfectly square) to the point where the rate of decay in the held peak voltage approaches the slope of Vsig just after a peak. In a prior art detector, this slow speed condition results in the difference signal at the comparator input not being able to exceed the hysteresis of the comparator and no output pulses are generated at low speeds.

On the other hand, in the present invention the P-counter 17 holds a count at the peak which causes the DAC 20 to hold the peak voltage indefinitely, waiting even hours or days, until the difference in the two signals Vsig and $V_{DAC-P}$ reaches Vhys, and thus enabling detection right down to a zero rate of passing articles.

The above description is to of a part of the proximity detector circuit (FIG. 1) that tracks and holds the peak of positive going (positive slope) portions of the amplified Hall voltage signal, Vsig. That description is yet missing the means for (a) terminating a time interval after $t_{ppk}$ in which the P-counter 17 is disabled, and for (b) changing Vout from high to low again. These functions depend upon the yet to be described part of the proximity detector of FIG. 1 which also tracks and holds the negative going (negative slope) portions of the amplified Hall voltage signal, Vsig.

In the dual polarity detector of FIG. 1, the negative going portions of Vsig are tracked and held at the negative peaks by the additional components: a first comparator 24, AND gate 25, N-counter 27, DAC 30, pulse expander circuit 31, and second comparator 26. These components are functionally complimentary to the above-described components, respectively the first comparator 14, AND gate 15, counter 17, DAC 20, pulse expander circuit 21, and second comparator 16, which track and hold the peak of the positive going portions of Vsig.

The negative input of first comparator 24 is connected to the output of Hall voltage amplifier 12. Logic block 32 generates a reset pulse that resets the N-counter 27 to zero count, only at the occurrence of a high-to-low transition in the signal Vout.

Figure 7:
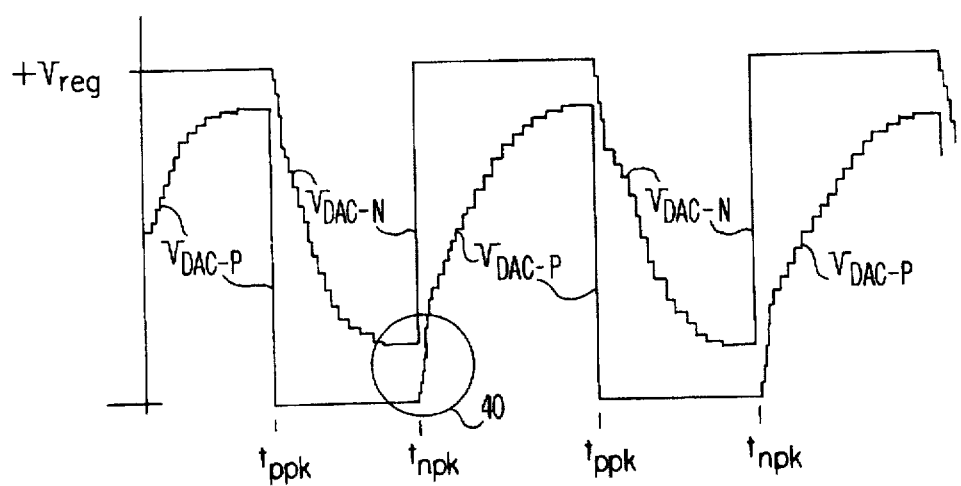
FIG. 7 shows the waveform of $V_{DAC-P}$ and $V_{DAC-N}$ which respectively track and hold Vsig. (Vsig is not shown in the interest of clarity.)
Figure 8:
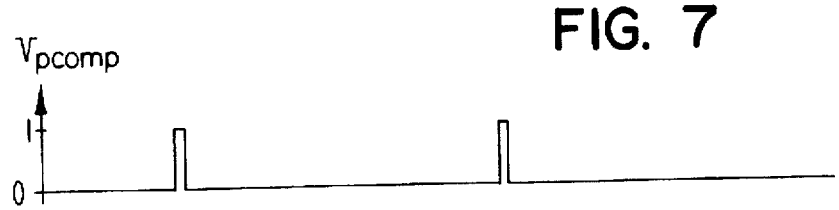
FIGS. 8 and 9 show respectively the signals Vpcomp and Vncomp, which are drawn to the same time scale as FIG. 7.
Figure 9:
Figure 10:
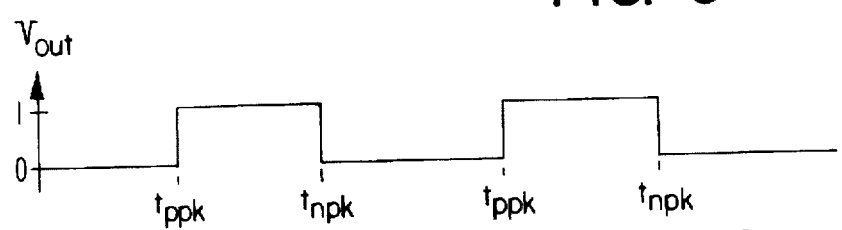
FIG. 10 shows the waveform of the output voltage signal, Vout, in the proximity detector of FIG. 1 and is drawn to the same scale as are the waveforms of FIG. 7.
Figure 11:
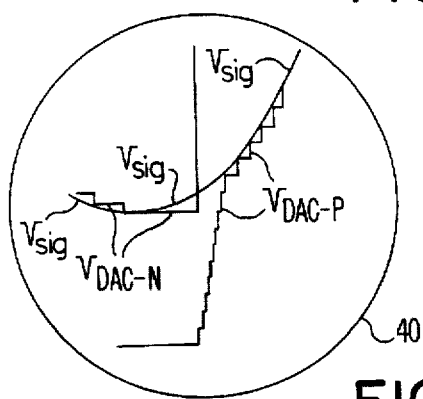
FIG. 11 shows an enlarged view of the detail 40 in the waveforms of FIG. 7.

The performance of the dual peak detecting proximity detector of FIG. 1 is indicated in FIGS. 7 through 11. In FIG. 7, $V_{DAC-P}$ is shown tracking Vsig during positive slope portions of Vsig. For clarity, the amplified Hall signal, Vsig, is not drawn in here. $V_{DAC-N}$ is shown tracking Vsig during negative slope portions of Vsig.

The output signal, Vout, (FIG. 10) is a square wave that is low during times when the amplified Hall voltage, Vsig, has a positive slope and is high when the amplified Hall voltage, Vsig, has a negative slope. Vout is thus a slope-polarity indicator and is applied directly to an input of the AND gate 15 to enable counting of N-counter 27 only during times when the slope of Vsig is negative and at negative peaks. On the other hand, Vout is applied to an input of the AND gate 15 through inventer 19 to enable counting by P-counter 17 only during times when the slope of Vsig is positive and at positive peaks. The output signal of the second comparators 26 is connected to the set inputs of flip flop 33.

6

The proximity sensor of FIG. 1 provides dual polarity peak detection leading to the capability for generating a square-wave output signal, Vout, having a profile that corresponds to that of passing gear teeth and the like. A peak detecting proximity detector of including essentially the same construction and operation is described in somewhat different terms in the patent application Ser. No. 08/587,407, filed simultaneously herewith, and entitled DETECTION OF PASSING MAGNETIC ARTICLES WHILE PERIODICALLY ADAPTING DETECTION THRESHOLDS TO CHANGING AMPLITUDES OF THE MAGNETIC FIELD. Another co-filed patent application Ser. No. 08/587, 406, entitled DETECTION OF PASSING MAGNETIC ARTICLES WITH AUTOMATIC GAIN CONTROL describes a similar analog-to-digital convertor followed by an analog to digital convertor for tracking and holding Vsig. These two co-filed applications are assigned to the same assignee, and are incorporated by reference herein to provide a fuller description.

We claim:

1. A method for detection of passing magnetic articles at speeds down to zero comprising:
   a) sensing an ambient magnetic field that is influenced by the passing of magnetic articles and generating a voltage, Vsig, that is proportional to the magnetic field;
   b) converting positive slope portions only of the analog signal Vsig to a digital signal $V_{Pcount}$;
   c) converting the digital signal $V_{Pcount}$ to a positive Vsig-tracking analog signal $V_{DAC-P}$;
   d) at each peak positive excursion in Vsig, holding $V_{Pcount}$ so that the analog signal $V_{DAC-P}$ is also held; and
   e) when, at time $t_{ppk}$ after each positive peak in Vsig, Vsig has fallen below $V_{DAC-P}$ by a predetermined amount, producing one detector pulse (Vpcomp) indicating the detection of approach of a passing magnetic article.

2. The method of claim 1 additionally comprising at time $t_{ppk}$ resetting the signal $V_{Pcount}$ to zero count and thus stopping the holding of $V_{DAC-P}$.

3. The method of claim 1 additionally comprising:
   a) converting negative slope portions only of the analog signal Vsig to a digital signal $V_{Ncount}$;
   b) converting the digital signal $V_{Ncount}$ to a negative Vsig-tracking analog signal $V_{DAC-N}$;
   c) at each peak negative excursion in Vsig, holding $V_{Ncount}$ so that the analog signal $V_{DAC-N}$ is also held; and
   d) when at time $t_{npk}$ after each negative peak in Vsig, Vsig has risen above $_{DAC-N}$ by a predetermined amount, producing another detector pulse (Vncomp) indicating the detection of leaving of a passing magnetic article.

4. The method of claim 3 additionally comprising at time $t_{npk}$ resetting the signal $V_{Ncount}$ to zero count and thus stopping the holding of $V_{DAC-N}$.

5. A method for detection of passing magnetic articles at speeds down to zero comprising:
   a) sensing an ambient magnetic field that is influenced by the passing of magnetic articles and generating a voltage, Vsig, that is proportional to the magnetic field;
   b) converting positive slope portions only of the analog signal Vsig to a digital signal $V_{Pcount}$;
   c) converting the digital signal $V_{Pcount}$ to a positive Vsig-tracking analog signal $V_{DAC-P}$;
   d) holding $V_{Pcount}$ at each peak positive excursion in Vsig;
   e) when at time $t_{ppk}$ after each positive peak in Vsig, Vsig has fallen below $V_{DAC-P}$ by a predetermined amount, producing one detector pulse (Vpcomp) indicating the detection of approach of a passing magnetic article;

f) converting negative slope portions only of the analog signal Vsig to a digital signal $V_{Ncount}$;

g) converting the digital signal $V_{Ncount}$ to a negative Vsig-tracking analog signal $V_{DAC-N}$;

h) holding $V_{Ncount}$ at each peak negative excursion in Vsig;

i) when at time $t_{npk}$ after each negative peak in Vsig, Vsig has risen above $V_{DAC-N}$ by a predetermined amount, producing another detector pulse (Vncomp) indicating the detection of leaving of a passing magnetic article;

j) at time $t_{ppk}$, enabling starting said converting the digital signal $V_{Ncount}$ to a negative Vsig-tracking analog signal $V_{DAC-N}$; and k) at time $t_{npk}$, starting said converting positive slope portions only of the analog signal Vsig to a digital signal $V_{Pcount}$.

6. The method of claim 5 additionally comprising generating a binary output signal that at times $t_{ppk}$ changes to one binary level and that at times $t_{npk}$ changes from the one to the other binary level, so that the binary output signal is at one level when the magnetic-field proportional signal, Vsig, has a positive slope and is at the other level when the magnetic-field proportional signal, Vsig, has a negative slope.

7. A method for detection of passing magnetic articles at speeds down to zero comprising:

a) sensing an ambient magnetic field that is influenced by the passing of magnetic articles and generating a voltage, Vsig, that is proportional to the magnetic field;

b) generating a stream of clock pulses;

c) performing steps to generate a voltage, $V_{DAC-P}$, that tracks each positive going portion of Vsig and holds the following positive peak value in Vsig for an interval beyond the time of the positive peak until Vsig recedes from the held positive peak value by a predetermined amount, Vhys, the steps comprising:

c1) providing one digital-to-analog converter (P-DAC) and one counter having a digital output connected to the input of said P-DAC and applying a DC energizing voltage to said P-DAC;

c2) when Vsig is positive going, enabling said one counter to count the clock pulses only when Vsig exceeds $V_{DAC-P}$ by a predetermined amount until at a time $t_{ppk}$ after the positive peak in Vsig, at which Vsig recedes from the positive peak value by a predetermined voltage, Vhys;

c3) at time $t_{ppk}$, resetting and disabling said one counter to cause $V_{DAC-P}$ to go to zero volts;

d) performing steps to generate a voltage, $V_{DAC-N}$, that tracks each negative going portion of Vsig and holds the following negative peak value in Vsig for a interval beyond the time of the negative peak until Vsig recedes from the held negative peak value by a predetermined amount, Vhys, the steps comprising:

d1) providing another digital-to-analog converter (N-DAC) and a another counter having a digital output connected to the input of said N-DAC, and applying a DC energizing voltage to said N-DAC;

d2) when Vsig is negative going, enabling said another counter to count the clock pulses, only when Vsig falls below $V_{DAC-N}$ by a predetermined amount, until at a time $t_{npk}$ after the negative peak in Vsig, at which Vsig recedes from the negative peak value by a predetermined voltage, Vhys; and d3) at time $t_{npk}$, resetting and disabling said another counter to cause $V_{DAC-N}$ to go to positive DAC energizing voltage; and e) generating a binary output signal that at times $t_{ppk}$ changes to one binary level and that at times $t_{npk}$ changes from the one to the other binary level, so that the binary output signal is at one level when the magnetic-field proportional signal, Vsig, has a positive slope and is at the other level when the magnetic-field proportional signal, Vsig, has a negative slope.

8. A proximity sensor of magnetic articles comprising:

a) a magnetic-field-to-voltage transducer for generating a signal, Vsig, that is proportional to the ambient magnetic field;

b) one transducer-voltage comparator (OTVcomp) having an output, and having one and another differential inputs; and c) a first circuit branch means, connected between the output of said transducer and said one OTVcomp input, for applying the signal, Vsig, directly to said one OTVcomp input;

wherein the improvement comprises:

a second circuit branch means connected between said transducer output and said another OTVcomp input, said second branch means comprising:

d1) one Schmitt comparator (OScomp) having an output, and having one and another differential inputs, one of said inputs being connected to said transducer output;

d2) a clock for generating a stream of clock pulses;

d3) one digital-to-analog converter (P-DAC), having an output connected to said another input of said OTVcomp;

d4) one AND gate having two inputs and an output;

d5) one counter means having a count input connected to the output of said clock, and having a count enable input connected to the output of said OTVcomp via said one AND gate including said OTVcomp output being connected to one of said one AND gate inputs, said one counter means being for counting the clock pulses only when an enable signal at the one binary level appears at said count enable input, said one counter means being for counting the clock pulses only when Vsig has a positive slope; and said P-DAC additionally being for tracking a positive slope portion of Vsig and holding the ensuing positive peak voltage of Vsig until a time $t_{ppk}$ at which Vsig recedes from the held positive peak voltage by an amount equal to the threshold of said OScomp, said OScomp for producing an output pulse at $T_{ppk}$ indicative of the approach of a passing magnetic article.

9. The proximity sensor of claim 8 wherein said first and second circuit branch means and said OScomp together are designated a positive peak detector (PPD), and additionally comprising a negative peak detector (NPD) means that is symmetrically complimentary to said positive peak detector means, said NPD means comprising another transducer-voltage comparator (ATVcomp), another first circuit branch means, connected between the output of said transducer and said ATVcomp input, for applying the signal, Vsig, directly to said another ATVcomp input and another second branch means connected between said transducer output and said another ATVcomp input, said another second branch means including another Schmitt comparator (AScomp), another digital-to-analog converter (N-DAC) having an output connected to said ATVcomp, another AND gate, another counter means with an enable input connected via said AND gate to said ATVcomp having an input connected to said clock and an output connected to said N-DAC, said N-DAC being for counting the clock pulses only when Vsig has a negative slope and for tracking a negative slope portion of Vsig and holding the ensuing negative peak voltage of Vsig until a time $t_{npk}$ at which Vsig recedes from the held positive peak voltage by an amount equal to the threshold of said AScomp, said AScomp being for producing an output pulse at $t_{npk}$ indicative of the leaving of a passing magnetic article.

10. The proximity sensor of claims 9 wherein said PPD additionally comprises one reset signal generating means connected to the output of said one Schmitt type comparator having an output connected to the reset input of said another counter means in said NPD for resetting said another one counter means at time $t_{ppk}$, and another reset signal generating means connected to the output of said another Schmitt type comparator having an output connected to the reset input of said one counter means in said PPD for resetting said one counter means at time $t_{npk}$.

11. A detector for detection of passing magnetic articles at speeds down to zero comprising:

a) a magnetic-field-to-voltage transducer means having a transducer output for generating at said transducer output a voltage, Vsig, that is proportional to the strength of the ambient magnetic field which is influenced by the passing of magnetic articles;

b) one first Schmitt comparator having an output, and having plus and minus differential input conductors, for producing a binary output voltage that changes to one binary level from the other when the magnitude of the differential voltage appearing at said differential input conductors exceeds a predetermined positive magnitude, Vhys;

c) a clock for generating a stream of clock pulses;

d) one digital-to-analog comparator, P-DAC, having an output, said plus and minus inputs of said one Schmitt comparator means connected respectively to said transducer output and to said P-DAC output;

e) one AND gate having two inputs and an output;

f) one counter means having a count input connected to the output of said clock, and having a count enable input connected to the output of said one first Schmitt comparator via said one AND gate, said one first Schmitt comparator output connected to one of said one AND gate inputs, said one counter means being for counting the clock pulses only when an enable signal at the one binary level appears at said count enable input, said one counter means being for counting the clock pulses only when Vsig has a positive slope, said P-DAC being additionally for tracking each positive slope portions of Vsig and holding the ensuing positive peak voltage of Vsig until a time $t_{ppk}$;

g) one second Schmitt comparator having a threshold voltage, Vhys, and having one input connected to said transducer means output and another input connected to said P-DAC output, for producing a pulse at one level when at a time, $t_{ppk}$, Vsig recedes Vhys volts from the held positive voltage;

h) a flip flop means having a reset input, and having a set input connected to the output of said one second Schmitt comparator, for generating a square wave output signal that goes to one binary level when set and goes to the other level when reset, the set input of said flip flop connected to said one second Schmitt comparator;

i) another first Schmitt comparator having an output, and having minus and plus differential input conductors, for producing a binary output voltage that changes to one binary level from the other when the magnitude of the differential voltage appearing at said differential input conductors exceeds a predetermined negative magnitude, Vhys;

j) another digital-to-analog comparator, N-DAC, having an output, said minus and plus inputs of said one Schmitt comparator connected respectively to said transducer output and to said N-DAC output;

k) another AND gate having two inputs and an output;

l) another counter means having a count input connected to the output of said clock, and having a count enable input connected to the output of said another first Schmitt comparator via said another AND gate, said another first Schmitt comparator means output connected to one of said another AND gate inputs, said another counter means being for counting the clock pulses only when an enable signal at the another binary level appears at said count enable input, said another counter means being for counting the clock pulses only when Vsig has a negative slope, said N-DAC additionally being for tracking each negative slope portions of Vsig and holding the ensuing negative peak voltage of Vsig until a time $t_{npk}$; and m) another second Schmitt comparator having a threshold voltage, Vhys, and having one input connected to said transducer means output and another input connected to said P-DAC output, and for producing a pulse at one level when at the time, $t_{ppk}$, Vsig recedes Vhys volts from the held negative voltage; said another second Schmitt comparator having an output connected to the reset input of said flip flop for causing said square wave output signal to go to the other level at times $t_{npk}$.

* * * * *